United States Patent
Zhang

(10) Patent No.: US 9,711,580 B2
(45) Date of Patent: Jul. 18, 2017

(54) THIN FILM TRANSISTOR, ARRAY SUBSTRATE, DISPLAY DEVICE AND MANUFACTURING METHOD OF THE THIN FILM TRANSISTOR AND ARRAY SUBSTRATE

(71) Applicant: BOE TECHNOLOGY GROUP CO., LTD., Beijing (CN)

(72) Inventor: Li Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/091,774

(22) Filed: Apr. 6, 2016

(65) Prior Publication Data

US 2016/0300899 A1    Oct. 13, 2016

(30) Foreign Application Priority Data

Apr. 10, 2015 (CN) .......................... 2015 1 0171254

(51) Int. Cl.
*H01L 29/76* (2006.01)
*H01L 27/32* (2006.01)
(Continued)

(52) U.S. Cl.
CPC .......... *H01L 27/3262* (2013.01); *H01L 27/12* (2013.01); *H01L 51/102* (2013.01);
(Continued)

(58) Field of Classification Search
CPC .......... H01L 29/0696; H01L 29/41758; H01L 27/1214; H01L 27/1251

See application file for complete search history.

(56) References Cited

U.S. PATENT DOCUMENTS 5,573,958 A * 11/1996 Fukui .................. G02F 1/13458
 257/E21.414
8,030,642 B2 * 10/2011 Yang ..................... H01L 27/283
 257/40
(Continued)

FOREIGN PATENT DOCUMENTS

CN 102683193 A 9/2012
CN 104134697 A 11/2014
(Continued)

OTHER PUBLICATIONS

Chinese Office Action in Chinese Application No. 201510171254.4, mailed Dec. 3, 2015 with English translation.
(Continued)

*Primary Examiner* — Duy T Nguyen
(74) *Attorney, Agent, or Firm* — Collard & Roe, P.C.

(57) ABSTRACT

A thin film transistor, an array substrate and manufacturing method thereof, and a display device are provided. The thin film transistor includes an active layer, a source electrode, a drain electrode, and a first gate electrode, the first gate electrode is shaped in a ring. The active layer includes a first portion, a second portion and a third portion for connecting the first portion and the second portion. The first portion and the second portion are disposed horizontally, and connected to the source electrode and the drain electrode, respectively. The third portion is disposed obliquely, and has a channel provided thereon. At least one part of the channel is located on an inner side of the first gate electrode. The thin film transistor can be used in a display device.

14 Claims, 4 Drawing Sheets

(51) Int. Cl.
*H01L 27/12* (2006.01)
*H01L 51/52* (2006.01)
*H01L 51/10* (2006.01)

(52) U.S. Cl.
CPC ........ *H01L 51/105* (2013.01); *H01L 51/5212* (2013.01); *H01L 2251/306* (2013.01); *H01L 2251/308* (2013.01)

(56) References Cited

U.S. PATENT DOCUMENTS

| | | | |
|---|---|---|---|
| 8,748,880 B2 | 6/2014 | Yamazaki et al. | |
| 8,889,444 B2 | 11/2014 | Jiang | |
| 2007/0228469 A1 | 10/2007 | Nakano et al. | |
| 2011/0101356 A1* | 5/2011 | Yamazaki | H01L 27/1225 257/59 |
| 2011/0121288 A1* | 5/2011 | Yamazaki | H01L 27/1225 257/43 |
| 2013/0200367 A1* | 8/2013 | Yamazaki | H01L 29/41733 257/43 |
| 2013/0207101 A1* | 8/2013 | Yamazaki | H01L 29/41733 257/43 |

FOREIGN PATENT DOCUMENTS

| | | |
|---|---|---|
| CN | 204155937 U | 2/2015 |
| JP | 2011-129899 A | 6/2011 |
| KR | 10-2014-0021790 A | 2/2014 |

OTHER PUBLICATIONS

Notification to Grant the Patent Right (Notice of Allowance) in Chinese Application No. 201510171254.4, issued Mar. 1, 2016 with English translation.
Issued Patent for Chinese Application No. 201510171254.4 (CN 104779272 B) granted on Apr. 6, 2016 in Chinese with the Chinese granted claims with an English translation.

* cited by examiner

THIN FILM TRANSISTOR, ARRAY SUBSTRATE, DISPLAY DEVICE AND MANUFACTURING METHOD OF THE THIN FILM TRANSISTOR AND ARRAY SUBSTRATE

CROSS REFERENCE TO RELATED APPLICATIONS

Applicant claims priority under 35 U.S.C. §119 of Chinese Application No. 201510171254.4 filed on Apr. 10, 2015, the disclosure of which is incorporated by reference.

TECHNICAL FIELD

Embodiments of the present disclosure relate to a thin film transistor and an array substrate and manufacturing method thereof, a display device.

BACKGROUND

The charging or discharging speed of thin film transistors to pixels can be represented by a subthreshold swing, and the smaller the subthreshold swing, the faster the charging or discharging speed of thin film transistors to pixels. The subthreshold swing is defined as the change value of a gate voltage corresponding to the current change per ten times when a source-drain voltage is a constant. The subthreshold swing is associated with the electrostatic control capacity of the gate electrode of a thin film transistor over the channel, and when the electrostatic control capacity of the gate electrode over the channel is strong, the change value of the gate voltage corresponding to the current change per ten times is small, namely, the subthreshold swing is small.

SUMMARY

Embodiments of the present disclosure provide a thin film transistor, an array substrate and manufacturing method thereof, and a display device. Following technical solutions are provided according to the embodiments of the present disclosure.

An embodiment of the present disclosure provides a thin film transistor, which includes an active layer, a source electrode, a drain electrode, and a first gate electrode. The first gate electrode is shaped in a ring. The active layer includes a first portion, a second portion and a third portion connected between the first portion and the second portion. The first portion and the second portion are disposed horizontally, and connected to the source electrode and the drain electrode, respectively. The third portion is disposed obliquely, and has a channel provided thereon, and at least one part of the channel is located on an inner side of the first gate electrode.

In an example, the drain electrode is located on an inner side of the first gate electrode. The first gate electrode includes a gate bottom, and the gate bottom and the drain electrode are disposed in a same layer.

In an example, the source electrode is located on an inner side of the first gate electrode, and located on an outer side of the drain electrode. The first gate electrode further includes a gate top electrically connected to the gate bottom, and the gate top and the source electrode are disposed in a same layer.

In an example, the thin film transistor further includes a channel assistant layer. The drain electrode, the channel assistant layer, the active layer and the source electrode are disposed in layers sequentially. The channel assistant layer has a first via hole corresponding to the drain electrode provided thereon, and the active layer is connected to the drain electrode through the first via hole.

In an example, the third portion of the active layer is an annular structure, and a second gate electrode is provided on an inner side of the third portion of the active layer.

In an example, the second gate electrode and the source electrode are disposed in a same layer.

In an example, the thin film transistor further includes a gate insulating layer, which is located between the active layer and the second gate electrode. A second via hole corresponding to the source electrode is provided on the gate insulating layer, and the active layer is connected to the source electrode through the second via hole. A blind hole corresponding to the second gate electrode is provided on the gate insulating layer, and the second gate electrode lies in the blind hole.

In an example, the third portion has a horizontal section shaped in a ring, the drain electrode is shaped in a circle, and the source electrode is shaped in a ring.

An embodiment of the present disclosure also provides an array substrate, which includes the thin film transistor.

In an example, the array substrate further includes an assistant electrode layer. A gate bottom, a gate top and the assistant electrode layer in the thin film transistor are disposed in layers sequentially, and the assistant electrode layer is electrically connected to the gate top. A projection of the assistant electrode layer on a plane where the drain electrode lies and the drain electrode have an overlapping region, and a projection of the third portion on the plane where the drain electrode lies is located in the overlapping region.

In an example, the array substrate further includes a pixel electrode, which is electrically connected to the source electrode and disposed in a same layer as the assistant electrode layer.

In an example, the assistant electrode layer is shaped in a ring with an opening, and the pixel electrode is electrically connected to the source electrode at the opening of the assistant electrode layer.

In an example, the array substrate further includes a passivation layer, which is located between the gate top and the assistant electrode layer. A third via hole corresponding to the assistant electrode layer and a fourth via hole corresponding to the pixel electrode are provided on the passivation layer. The gate top is electrically connected to the assistant electrode layer through the third via hole, and the source electrode is electrically connected to the pixel electrode through the fourth via hole.

In an example, the array substrate further includes a data line, the drain electrode is shaped in a circle, the gate bottom is shaped in a ring with an opening, and the drain electrode is electrically connected to the data line via a connecting structure passing through the opening of the gate bottom.

In an example, the source electrode is shaped in a ring with an opening, the gate top is shaped in a ring, and the second gate electrode is shaped in a circle. The second gate electrode is electrically connected to the gate top via a connecting structure passing through the opening of the source electrode.

An embodiment of the present disclosure also provides a display device including the array substrate.

In an example, the display device is an organic light-emitting diode display device, and the assistant electrode layer is an anode layer.

An embodiment of the present disclosure also provides a manufacturing method of a thin film transistor, which includes: forming a first conductive layer on a substrate, and forming a pattern that includes a gate bottom of a first gate electrode in a ring and a drain electrode; forming a channel assistant layer, and forming a first via hole corresponding to the drain electrode by a patterning process; forming a semiconductor layer, and forming a pattern that includes an active layer by a patterning process, the active layer including a first portion, a second portion and a third portion for connecting the first portion and the second portion, the first portion and the second portion being disposed horizontally, the third portion being disposed obliquely and having a channel provided therein, and at least one part of the channel being located on an inner side of the first gate electrode, and the second portion being connected to the drain electrode through the first via hole; forming a gate insulating layer, and forming a second via hole corresponding to a source electrode and a blind hole corresponding to a second gate electrode by a patterning process; and forming a second conductive layer, and forming a pattern that includes a gate top of the first gate electrode, the second gate electrode and the source electrode by a patterning process, the first portion being connected to the source electrode through the second via hole, and the second gate electrode lying in the blind hole.

An embodiment of the present disclosure also provides a manufacturing method of an array substrate includes the steps of manufacturing method of the thin film transistor.

In an example, the manufacturing method of the array substrate further includes forming a passivation layer on the substrate with the thin film transistor formed thereon, and forming a third via hole corresponding to an assistant electrode layer and a fourth via hole corresponding to a pixel electrode by a patterning process; forming a transparent conductive layer, and forming a pattern that includes the assistant electrode layer and the pixel electrode by a patterning process, the gate top being electrically connected to the assistant electrode layer through the third via hole, and the source electrode being electrically connected to the pixel electrode through the fourth via hole; and forming a data line while a pattern of the gate bottom and the drain electrode is formed.

BRIEF DESCRIPTION OF THE DRAWINGS

Embodiments of the present invention will be described in more detail below with reference to the accompanying drawings to allow an ordinary skill in the art to understand the present invention more clearly, in which.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
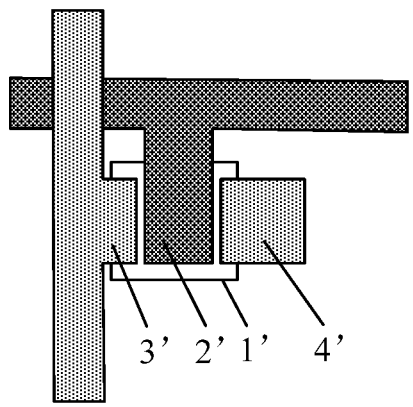
FIG. 1 is a plan view of a thin film transistor.

As shown in FIG. 1, a thin film transistor includes an active layer 1', a gate electrode 2', a source electrode 3', a drain electrode 4' and the like that are disposed in layers sequentially. The area of the active layer 1' between the source electrode 3' and the drain electrode 4' serves as a channel. It is noticed by inventor of the present application that the electrostatic control capacity of the gate electrode 2' in the above thin film transistor over the channel located between the source electrode 3' and the drain electrode 4' is relatively weak, so that the subthreshold swing of the thin film transistor is relatively large, and this leads to a relatively slow charging or discharging speed of the thin film transistor to a pixel.

Embodiment 1

Figure 2:
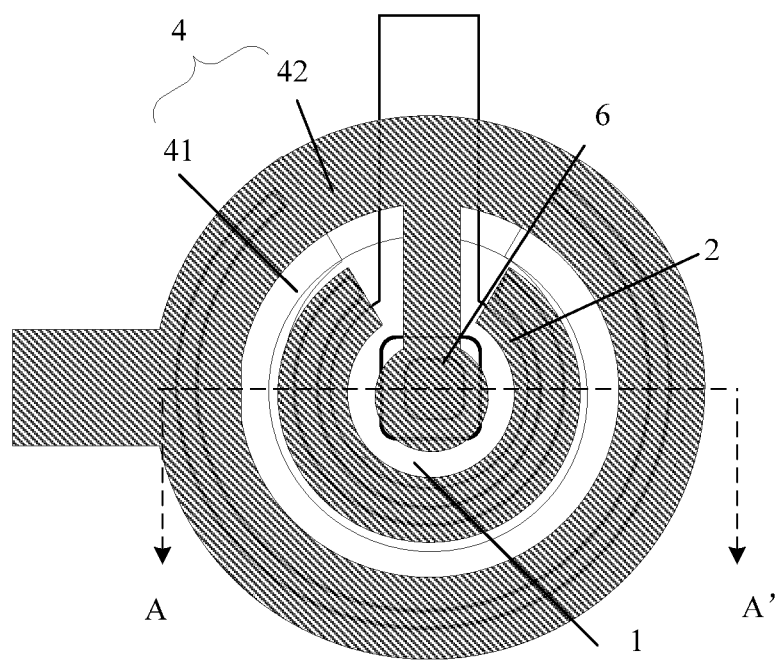
FIG. 2 is a plan view of a thin film transistor provided by an embodiment of the present disclosure.
Figure 3:
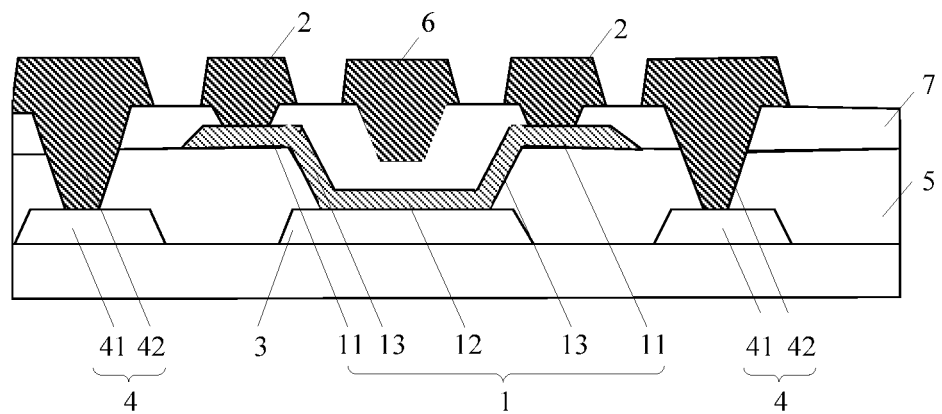
FIG. 3 is a sectional view taken along A-A' in FIG. 2.

According to an embodiment of the present disclosure, a thin film transistor is provided. As shown in FIG. 2 and FIG. 3, the thin film transistor includes an active layer 1, a source electrode 2, a drain electrode 3 and a first gate electrode 4, and the first gate electrode 4 is shaped in a ring. The active layer 1 includes a first portion 11, a second portion 12 and a third portion 13 connected between the first portion 11 and the second portion 12. The first portion 11 and the second portion 12 are disposed horizontally, and connected to the source electrode 2 and the drain electrode 3, respectively. The third portion 13 is disposed obliquely and has a channel provided thereon. At least one part of the channel is located on an inner side of the first gate electrode 4.

The active layer 1 may be made of material selected from the group consisting of an oxide, sulfide, nitride, oxysulfide or the like of at least one element of zinc (Zn), indium (In), tin (Sn), gallium (Ga), and aluminum (Al).

In the above embodiment, the first gate electrode 4 is shaped in a ring, and it is usable for making an electrostatic control of the third portion 13 of the active layer 1 functioning as a channel in each direction, so that the electrostatic control capacity of the first gate electrode 4 over the channel can be improved, and the subthreshold swing is lowered. The third portion 13 is obliquely disposed, to allow the source electrode 2 and the drain electrode 3 lying in different level structures, and occurrence of short circuit between the source electrode 2 and the drain electrode 3 can be prevented. Moreover, as compared to the case where a source electrode and a drain electrode lie in a same film layer, the distance between the source electrode 2 and the drain electrode 3 lying in different film layers is relatively far, and generation of a leakage current can be suppressed.

Continue to refer to FIG. 2 and FIG. 3, to allow at least part of the third portion 13 of the active layer 1 being located on an inner side of the first gate electrode 4, so that the first gate electrode 4 electrostatically controls the third portion 13 functioning as a channel in each direction, optionally, the drain electrode 3 is located on an inner side of the first gate electrode 4. The first gate electrode 4 includes a gate bottom 41, and the gate bottom 41 and the drain electrode 3 are disposed in a same layer. Due to the gate bottom 41 and the drain electrode 3 being disposed in the same layer, the gate bottom 41 and the drain electrode 3 can be formed simultaneously. Correspondingly, the manufacturing process of the thin film transistor can be simplified, and the manufacturing cost is saved. If the gate bottom 41 and the drain electrode 3 are formed simultaneously, the gate bottom 41 and the drain electrode 3 can be made of same material. Namely, the gate bottom 41 and the drain electrode 3 can be made of a metal selected from a group consisting of molybdenum (Mo), aluminum (Al), neodymium (Nd), copper (Cu), titanium (Ti), niobium (Nb), and tungsten (W), or an alloy of one or more of these metals.

In the above embodiment, for example, as shown in FIG. 3, the source electrode 2 is located on an inner side of the first gate electrode 4, and located on an outer side of the drain electrode 3. The first gate electrode 4 further includes a gate top 42 electrically connected to the gate bottom 41, and the gate top 42 and the source electrode 2 are disposed in a same layer. In such design, the source electrode 2 and the drain electrode 3 are each located on an inner side of the first gate electrode 4, the distance between the source electrode 2 and the drain electrode 3 is decreased. The length of the third portion 13 functioning as a channel can be shortened, and in turn, the length of the channel is shortened, and an on-state current can be raised. In addition, the first electrode 4 further includes the gate top 42 electrically connected to the gate bottom 41, when a voltage is applied to the third portion 13 by the gate bottom 41, a voltage is also applied to the third portion 13 by the gate top 42, and the control capacity of the first gate electrode 4 over the channel can be further improved. Thus, the subthreshold swing of the thin film transistor can be further lowered. Moreover, the gate top 42 and the source electrode 2 are disposed in a same layer, to allow the gate top 42 and the source electrode 2 being formed simultaneously. Correspondingly, the manufacturing process of the thin film transistor can be simplified, and the manufacturing cost is saved. When the gate top 42 and the source electrode 2 are formed simultaneously, the gate top 42 and the source electrode 2 are made of same material, for example, a metal selected from a group consisting of molybdenum (Mo), aluminum (Al), neodymium (Nd), copper (Cu), titanium (Ti), niobium (Nb), and tungsten (W), or an alloy of one or more of these metals.

In the above embodiment, for example, the thin film transistor further includes a channel assistant layer 5, and the drain electrode 3, the channel assistant layer 5, the active layer 1 and the source electrode 2 are disposed in layers sequentially. A first via hole corresponding to the drain electrode 3 is provided on the channel assistant layer 5, and the active layer 1 is connected to the drain electrode 3 through the first via hole. With such design, the channel assistant layer 5 is located between the drain electrode 3 and the active layer 1, and usable for assisting in defining the length of the third portion 13 of the active layer 1. This is helpful in formation of the third portion 13 with a shorter length, and thus, an on-state current of the thin film transistor can be raised. Furthermore, the area of the thin film transistor can be made to be smaller, and thus the aperture ratio can be raised.

Additionally, in the above embodiment, the positional relationship between the drain electrode 3, the channel assistant layer 5, the active layer 1 and the source electrode 2 in the thin film transistor may also be other positional relationship. Exemplarily, the positional relationship between a drain electrode 3, a channel assistant layer 5, an active layer 1 and a source electrode 2 may be the case that the source electrode 2, the channel assistant layer 5, the active layer 1 and the drain electrode 3 are disposed in layers sequentially. With such design, the channel assistant layer 5 is disposed between the source electrode 2 and the active layer 1, and usable for defining the length of the third portion 13 of the active layer 1. Consequently, an on-state current of the thin film transistor can also be raised, and the aperture ratio can be enhanced. In embodiments of the present disclosure, the structure of the thin film transistor has been described with reference to an example in which the positional relationship between a drain electrode 3, a channel assistant layer 5, an active layer 1 and a source electrode 2 is the case that the drain electrode 3, the channel assistant layer 5, the active layer 1 and the source electrode 2 are disposed in layers sequentially.

Please continue to refer to FIG. 2 and FIG. 3, in the above embodiment, the third portion 13 of the active layer 1 is an annular structure, and a second gate electrode 6 is disposed on an inner side of the third portion 13 of the active layer 1. Because the thin film transistor includes the first gate electrode 4 and the second gate electrode 6, which serve to respectively apply a voltage to the third portion 13 functioning as a channel from an outer side and an inner side so that a channel can be formed on each of an inner surface and an outer surface of the third portion 13, an on-state current of the thin film transistor can be increased. For example, this also allows each of inner and outer surfaces and the inside of the third portion 13 to be depleted, and thus the transconductance characteristics can be enhanced. In addition, controlling the channel jointly with two gate electrodes allows the carrier flow within the channel to be relatively stable, and thus the threshold voltage shift can be suppressed.

Optionally, as shown in FIG. 3, the second gate electrode 6 and the source electrode 2 are disposed in a same layer. With such design, the second gate electrode 6 and the source electrode 2 can be formed simultaneously, and thus the manufacturing process of the thin film transistor can be simplified. Furthermore, due to the gate bottom 41 and the drain electrode 3 are disposed in a same layer and the source electrode 2 and the drain electrode 3 lie in different level structures, the second gate electrode 6 and the gate bottom 41 lie in different level structures. This allows the formed electrical field direction is perpendicular to the tilting direction of the obliquely disposed third portion 13 when a voltage is applied to the third portion 13 by the second gate electrode 6 and the gate bottom 41. That is, the electric field direction is consistent with the crystalline orientation of material of the third portion 13. Consequently, the flow rate of carriers will not be hindered. When the second gate electrode 6 and the source electrode 2 are formed simultaneously, the second gate electrode 6 and the source electrode 2 can be made of same material, which can be metal selected from a group consisting of molybdenum (Mo), aluminum (Al), neodymium (Nd), copper (Cu), titanium (Ti), niobium (Nb), and tungsten (W), or an alloy of one or more of these metals.

Optionally, to allow the second gate electrode 6 and the active layer being insulated from each other, the thin film transistor further includes a gate insulating layer 7 that is located between the active layer 1 and the second gate electrode 6. The second gate electrode 6 and the source electrode 2 are disposed in a same layer, the gate insulating layer 7 is also located between the active layer 1 and the source electrode 2. To connect the active layer 1 to the source electrode 2, a second via hole corresponding to the source electrode 2 is provided on the gate insulating layer 7, and the active layer 1 is connected to the source electrode 2 through the second via hole. Besides, a blind hole corresponding to the second gate electrode 6 is also provided on the gate insulating layer 7, and the second gate electrode 6 lies in the blind hole. With such design, the second gate electrode 6 and the active layer 1 can be insulated from each other, and the second gate electrode 6 can be apart from the third portion 13 of the active layer 1 functioning as a channel at shorter distance. Consequently, the control capacity of the second gate electrode 6 over the channel can be strengthened.

In the above embodiment, the shape of a horizontal section of the third portion 13 of the active layer 1 may be a semi-ring, a ring, a hollowed rectangle or other pattern. For example, the shape of a horizontal section of the third portion 13 of the active layer 1 is a ring, the shape of the drain electrode 3 is a circle, and the shape of the source electrode is a ring. With such design, all positions in the third portion 13 of the active layer 1 can be made to be apart from the first gate electrode 4 at equal distance, to allow the electrostatic control of the first gate electrode 4 over each position being the same. Furthermore, as the shape of a horizontal section of the third portion 13 functioning as a channel is a ring, width of the channel is circumference of the ring. Compared with the prior art, width of the channel in embodiments of the present disclosure is increased significantly, and an on-state current can be raised. In addition, as compared to a rectangular active layer, the area occupied by an annular active layer of the present application is relatively small, and thus it is possible that area of the thin film transistor is decreased, and the aperture ratio is enhanced.

The thin film transistor provided by the embodiments of the present disclosure has the above structure. As the shape of the first gate electrode included by the thin film transistor is a ring, and it can electrostatically control the third portion of an active layer functioning as a channel in each direction, the electrostatic control capacity of the first gate electrode over the channel can be improved. Consequently, the subthreshold swing of the thin film transistor can be lowered, and the display performance of the display device is enhanced.

Embodiment 2

Figure 4:
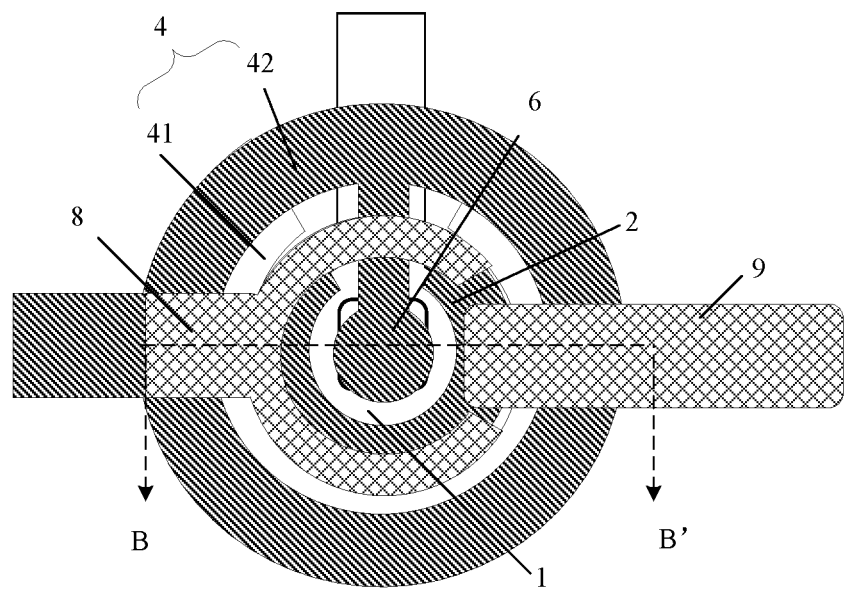
FIG. 4 is a plan view of an array substrate that includes the thin film transistor in FIG. 2.
Figure 5:
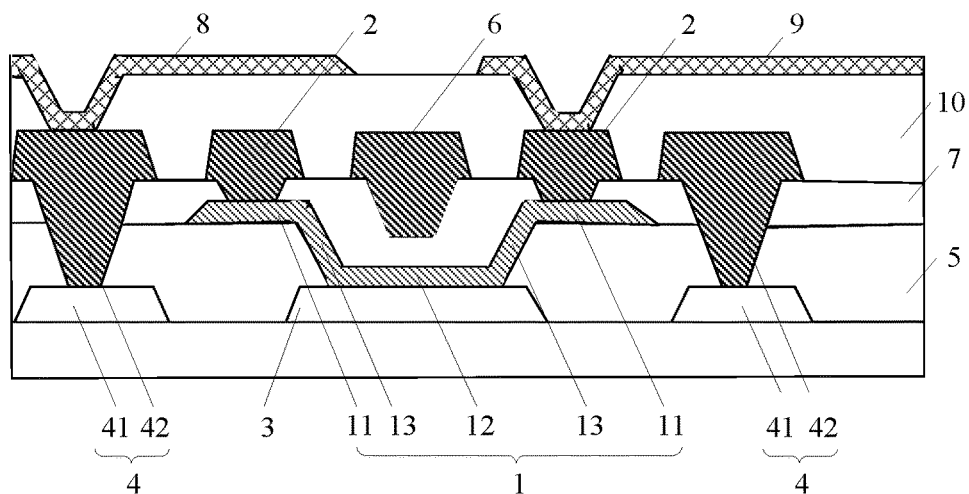
FIG. 5 is a sectional view taken along B-B' in FIG. 4.

Please refer to FIG. 4 and FIG. 5, according to an embodiment of the present disclosure, an array substrate is provided, which includes the thin film transistor provided in the above embodiment. Compared to an array substrate in prior art, as the above thin film transistor is provided in the array substrate provided by embodiments of the present disclosure, and the electrostatic control capacity of a first gate electrode 4 in the thin film transistor over the channel is relatively strong, the subthreshold swing can be lowered. In turn, the display performance of the display device is enhanced.

Optionally, as shown in FIG. 4 and FIG. 5, to avoid a high-resistance region being produced in a third portion 13 of an active layer 1, the array substrate further includes an assistant electrode layer 8. A gate bottom 41, a gate top 42 and the assistant electrode layer 8 in the thin film transistor are disposed in layers sequentially, and the assistant electrode layer 8 is electrically connected to the gate top 42. The projection of the assistant electrode layer 8 onto the plane where the drain electrode 3 lies and the drain electrode 3 have an overlapping region, and the projection of the third portion of the active layer 1 onto the plane where the drain electrode 3 lies is situated within the overlapping region. As the assistant electrode layer 8 is electrically connected to the gate top 42 of the first gate electrode 4, a voltage applied to the assistant electrode layer 8 is the same as a voltage applied to the gate bottom 41 and the gate top 42 of the first gate electrode 4. When a voltage is applied by the first gate electrode 4 from the side of the third portion 13, a voltage is applied by the assistant electrode layer 8 to the third portion 13 of the active layer 1 from upper of the third portion 13. As a result, the carrier distributed in the third portion 13 of the active layer 1 can be uniformed, and a high-resistant region will not be generated. The assistant electrode layer 8 may be made of material selected from a group consisting of one or more of oxides of indium (In), zinc (Zn), and tin (Sn).

For example, as shown in FIG. 4 and FIG. 5, the array substrate further includes a pixel electrode 9, which is electrically connected to a source electrode 2 and disposed in a same layer as the assistant electrode layer 8. With such design, the pixel electrode 9 and the assistant electrode layer 8 can be formed simultaneously. The manufacturing process of the array substrate can be simplified, and the manufacturing cost is saved. When the pixel electrode 9 and the assistant electrode layer 8 are formed simultaneously, the pixel electrode 9 and the assistant electrode layer 8 are made of same material, namely, it may be selected from a group consisting of one or more of oxides of indium (In), zinc (Zn), and tin (Sn).

In the above embodiment, the assistant electrode layer 8 may have various shapes or profiles, and exemplarily, it may be a ¼ ring, a semi-ring, ¾ ring, a ring or the like. For example, as shown in FIG. 4 and FIG. 5, the shape of the assistant electrode layer 8 is a ring with an opening, and the pixel electrode 9 is electrically connected to the source electrode 2 at the opening of the assistant electrode layer 8. The opening of the above ring is designed to be as small as possible, which allows the assistant electrode layer 8 to apply a voltage to the whole upper part of the third portion 13 approximately, and the carrier distributed in the third portion 13 can be uniformed.

In the above embodiment, continue to refer to FIG. 5, to allow the assistant electrode layer 8 being insulated from the source electrode 2, and the pixel electrode 9 being insulated from the gate top 42, the array substrate further includes a passivation layer 10 located between the gate top 42 and the assistant electrode layer 8, and moreover, to allow the assistant electrode layer 8 being electrically connected to the gate top 42, a third via hole corresponding to the assistant electrode layer 8 is provided on the passivation layer 10, and the gate top 42 is electrically connected to the assistant electrode layer 8 through the third via hole. In addition, to allow the pixel electrode 9 being electrically connected to the source electrode 2, a fourth via hole corresponding to the pixel electrode 9 is also provided on the passivation layer 10, and the source electrode 2 is electrically connected to the pixel electrode 9 through the fourth via hole.

Figure 6:
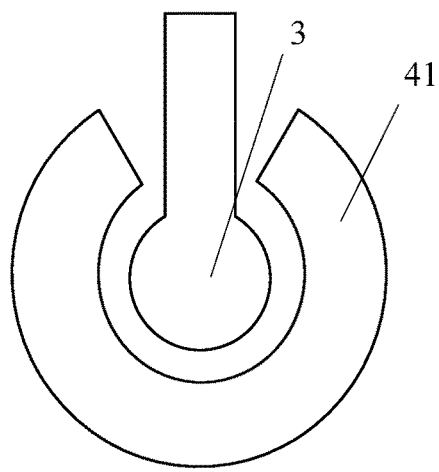
FIG. 6 is a plan view of a layered structure that includes a drain electrode and a gate bottom in FIG. 5.

As shown in FIG. 6, the array substrate further includes a data line (not shown), and the shape of the drain electrode 3 is a circle. To allow the drain electrode 3 being electrically connected to the data line, optionally, the shape of the gate bottom 41 is a ring with an opening, and the drain electrode 3 is electrically connected to the data line via a connecting structure passing through the opening of the gate bottom 41.

Figure 7:
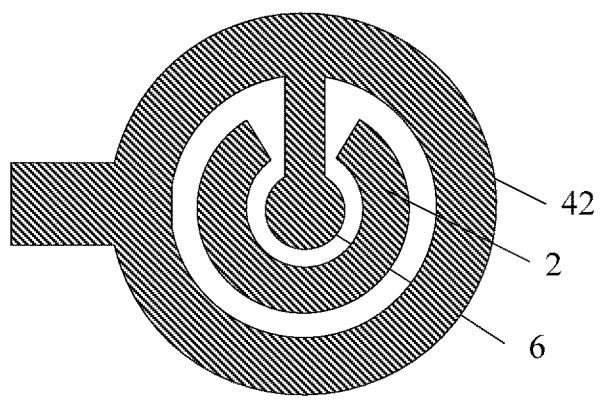
FIG. 7 is a plan view of a layered structure that includes a gate top, a source electrode and a second gate electrode in FIG. 5.

Optionally, as shown in FIG. 7, to allow a first gate electrode 4 being electrically connected to a second gate electrode 6, the shape of a source electrode 2 is a ring with an opening, the shape of a gate top 42 is a ring, the shape of the second gate electrode 6 is a circle, and the second gate electrode 6 is electrically connected to the gate top 42 via a connecting structure passing through the opening of the source electrode 2. With such design, it is not necessary applying voltages to the first gate electrode 4 and the second gate electrode 6, respectively, and the driving method of the array substrate can be simplified. Optionally, the array substrate further includes a gate line (not shown), and the gate top 42 is electrically connected to the gate electrode via another connecting structure that is connected to the gate top 42.

The array substrate provided by the embodiments of the present disclosure has the above-mentioned structure. Compared to an array substrate in prior art, as the above thin film transistor is provided in the array substrate provided by the embodiments of the present disclosure, and the electrostatic control capacity of a first gate electrode in the thin film transistor over the channel is relatively strong, the sub-threshold swing can be lowered, and in turn, the display performance of the display device can be enhanced.

Besides, according to an embodiment of the present disclosure, a display device is provided. The display device includes the array substrate mentioned in the above embodiments. The display device may be an electronic paper, a cell phone, a tablet computer, a television, a display, a notebook computer, a navigator or any other product or component having a display function. Optionally, the display device is an organic light-emitting diode display device, and the assistant electrode layer is an anode layer. With such design, it is not necessary producing an assistant electrode layer separately, and the manufacturing process of the display device can be simplified.

Embodiment 3

Figure 8:
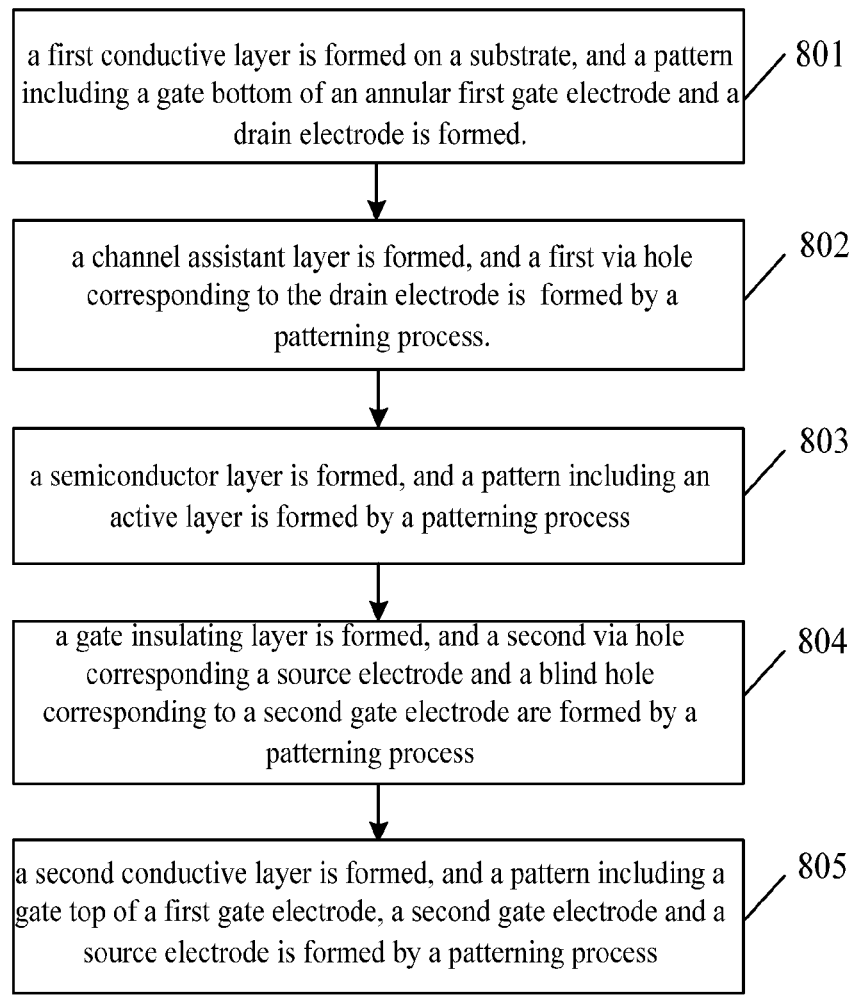
FIG. 8 is a flowchart illustrating the manufacturing method of a thin film transistor provided by an embodiment of the present disclosure.

According to an embodiment of the present disclosure, a manufacturing method of a thin film transistor is provided, as shown in FIG. 8, which includes the following steps.

Step 801, a first conductive layer is formed on a substrate, and a pattern including a gate bottom of an annular first gate electrode and a drain electrode is formed. Exemplarily, by a plasma enhanced chemical vapor deposition process, a sputtering process, a thermal evaporating process or the like, a first conductive layer is formed on a substrate, and a photoresist is coated on the first conductive layer. The first conductive layer coated with the photoresist is covered by a mask with pattern of a gate bottom and a drain electrode, and after exposure, development, etching and other steps are carried out, a pattern including the gate bottom and the drain electrode is formed.

Step 802, on the substrate with the pattern including the gate bottom and the drain electrode formed thereon, a channel assistant layer is formed, and a first via hole corresponding to the drain electrode is also formed by a patterning process. Exemplarily, by a plasma enhanced chemical vapor deposition process, a sputtering process, a thermal evaporating process or the like, a channel assistant layer is formed on the substrate with the pattern including the gate bottom and the drain electrode formed thereon, and after that, a first via hole corresponding to the drain electrode is formed on the channel assistant layer by a patterning process.

Step 803, a semiconductor layer is formed on the substrate with the channel assistant layer formed thereon, and a pattern including an active layer is formed by a patterning process. The active layer includes a first portion, a second portion and a third portion connected between the first portion and the second portion. The first portion and the second portion are disposed horizontally, and the third portion is disposed obliquely and has a channel provided thereon. At least one part of the channel is located on an inner side of the first gate electrode, and the second portion is connected to the drain electrode through the first via hole. Exemplarily, by a plasma chemical vapor depositing process or the like, a semiconductor layer is formed on the substrate with the channel assistant layer formed thereon, and a photoresist is coated on the semiconductor layer. The semiconductor layer coated with the photoresist is covered by a mask with a pattern including an active layer, and after exposure, development and other steps are carried out, a pattern including the active layer is formed.

Step 804, on the substrate with the pattern including the active layer formed thereon, a gate insulating layer is formed, and a second via hole corresponding a source electrode and a blind hole corresponding to a second gate electrode are formed by a patterning process. Exemplarily, by a plasma enhanced chemical vapor deposition process, a sputtering process, a thermal evaporation process or the like, a gate insulating layer is formed on the substrate with the pattern including the active layer formed thereon, and after that, a second via hole corresponding a source electrode and a blind hole corresponding to a second gate electrode are formed on the gate insulating layer by a patterning process. A semi-transparent mask may be used to form the second via hole and the blind hole.

Step 805, a second conductive layer is formed on the substrate with the gate insulating layer formed thereon, and a pattern including a gate top of a first gate electrode, a second gate electrode and a source electrode is formed by a patterning process. The first portion is connected to the source electrode through the second via hole, and the second gate electrode lies in the blind hole. Exemplarily, by a plasma enhanced chemical vapor deposition process, a sputtering process, a thermal evaporation process or the like, a second conductive layer is formed on the substrate with the gate insulating layer formed thereon, and a photoresist is coated on the second conductive layer. The second conductive layer coated with the photoresist is covered by a mask with a pattern of a gate top, a second gate electrode and a source electrode, and after exposure, development, etching and other steps are performed, a pattern including the gate top, the second gate electrode and the source electrode is formed.

In the manufacturing method of the thin film transistor provided by embodiments of the present disclosure, the shape of a first gate electrode of the produced thin film transistor is a ring, which enables an electrostatic control of a third portion of an active layer functioning as a channel in each direction, so the electrostatic control capacity of the first gate electrode over the channel can be enhanced. Consequently, the subthreshold swing can be lowered, and the display performance of the display device is enhanced.

Embodiment 4

Figure 9:
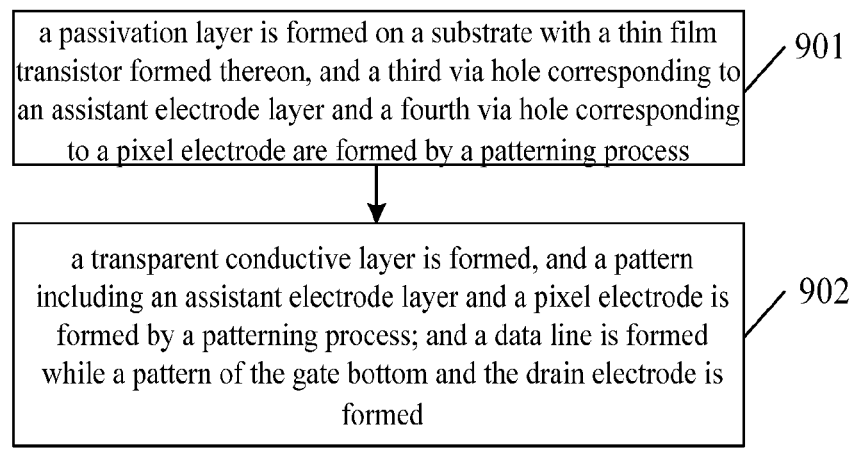
FIG. 9 is a flowchart illustrating the manufacturing method of an array substrate provided by an embodiment of the present disclosure.

According to an embodiment of the present disclosure, a manufacturing method of an array substrate is provided, which includes the manufacturing method of the thin film transistor provided by the above embodiments. As shown in FIG. 9, the manufacturing method of the array substrate further includes following steps.

Step 901, a passivation layer is formed on a substrate with a thin film transistor formed thereon, and a third via hole corresponding to an assistant electrode layer and a fourth via hole corresponding to a pixel electrode are formed by a patterning process. Exemplarily, by a plasma enhanced chemical vapor deposition process, a sputtering process, a thermal evaporation process or the like, a passivation layer is formed on the substrate with the thin film transistor formed thereon, and a third via hole corresponding to an assistant electrode layer and a fourth via hole corresponding to a pixel electrode are formed by a patterning process.

Step 902, a transparent conductive layer is formed on the substrate with the passivation layer formed thereon, and a pattern including an assistant electrode layer and a pixel electrode is formed by a patterning process; and a data line is formed while a pattern of the gate bottom and the drain electrode is formed. The gate top is electrically connected to the assistant electrode layer through the third via hole, and the source electrode is electrically connected to the pixel electrode through the fourth via hole. Exemplarily, a transparent conductive layer may be formed on the substrate with the passivation layer formed thereon by a depositing process, a sputtering process, coating or the like, and after that, a photoresist is coated on the transparent conductive layer. The transparent conductive layer with the photoresist coated thereon is covered by a mask with a pattern including an assistant electrode layer and a pixel electrode, and after exposure, development, etching and other steps are performed, a pattern including the assistant electrode layer and the pixel electrode is formed.

The manufacturing method of the array substrate provided by embodiments of the present disclosure is employed, the display performance of the display device can be enhanced.

Various embodiments in the specification have been described in a progressive manner, the same or similar parts in the embodiments can make mutual reference, and the described in each embodiment is the difference between it and the other embodiments. Especially, in terms of the method embodiments, since they are basically similar to the product embodiments, their description are simplified, and regarding relevant parts, reference can be made to the descriptions of those parts in the product embodiments.

The described above are merely specific embodiments of the present disclosure, but the protection scope of the present disclosure is not limited thereto. Various variants or replacements, which can be readily made by one of ordinary skill in the art without departing from the scope of the present disclosure, shall all fall in the protection scope of the present disclosure.

This application claims priority to Chinese Patent Application No. 201510171254.4, filed on Apr. 10, 2015, and entitled "a thin film transistor and an array substrate and manufacturing method thereof, a display device", which is incorporated herein by reference in its entirety.

What is claimed is:

1. A thin film transistor, comprising an active layer, a source electrode, a drain electrode, and a first gate electrode, the first gate electrode being shaped in a ring;
   wherein the active layer includes a first portion, a second portion and a third portion connected between the first portion and the second portion, the first portion and the second portion are disposed horizontally, and connected to the source electrode and the drain electrode, respectively, the third portion is disposed obliquely and has a channel provided thereon, and at least one part of the channel is located on an inner side of the first gate electrode, wherein the drain electrode is located on an inner side of the first gate electrode, the first gate electrode includes a gate bottom, and the gate bottom and the drain electrode are disposed in a same layer.

2. The thin film transistor according to claim 1, wherein the source electrode is located on an inner side of the first gate electrode and located on an outer side of the drain electrode, the first gate electrode further includes a gate top electrically connected to the gate bottom, and the gate top and the source electrode are disposed in a same layer.

3. The thin film transistor according to claim 2, further comprising a channel assistant layer; the drain electrode, the channel assistant layer, the active layer and the source electrode being disposed in layers sequentially, the channel assistant layer having a first via hole corresponding to the drain electrode provided thereon, and the active layer being connected to the drain electrode through the first via hole.

4. The thin film transistor according to claim 3, wherein a horizontal section of the third portion is shaped in a ring, the drain electrode is shaped in a circle, and the source electrode is shaped in a ring.

5. The thin film transistor according to claim 1, wherein the third portion of the active layer is shaped in an annular structure, and a second gate electrode is disposed on an inner side of the third portion of the active layer.

6. The thin film transistor according to claim 5, wherein the second gate electrode and the source electrode are disposed in a same layer.

7. The thin film transistor according to claim 6, further comprising a gate insulating layer, which is located between the active layer and the second gate electrode and has a second via hole corresponding to the source electrode provided thereon, and the active layer being connected to the source electrode through the second via hole; and
   the gate insulating layer having a blind hole corresponding to the second gate electrode provided thereon, and the second gate electrode lying in the blind hole.

8. An array substrate, comprising:
   a thin film transistor, wherein the thin film transistor comprises an active layer, a source electrode, a drain electrode, and a first gate electrode, the first gate electrode being shaped in a ring, wherein the active layer includes a first portion, a second portion and a third portion connected between the first portion and the second portion, the first portion and the second portion are disposed horizontally, and connected to the source electrode and the drain electrode, respectively, the third portion is disposed obliquely and has a channel provided thereon, and at least one part of the channel is located on an inner side of the first gate electrode; and
   an assistant electrode layer, a gate bottom, a gate top and the assistant electrode layer in the thin film transistor being disposed in layers sequentially, and the assistant electrode layer being electrically connected to the gate top, a projection of the assistant electrode layer on the plane where the drain electrode lies and the drain electrode having an overlapping region, and a projection of the third portion on the plane where the drain electrode lies being situated within the overlapping region.

9. The array substrate claimed as claim 8, wherein the array substrate further includes a pixel electrode, which is electrically connected to the source electrode and is disposed in a same layer as the assistant electrode layer.

10. The array substrate according to claim 9, wherein the assistant electrode layer is shaped in a ring with an opening, and the pixel electrode is electrically connected to the source electrode at the opening of the assistant electrode layer.

11. The array substrate according to claim 9, further comprising a passivation layer, which is located between the gate top and the assistant electrode layer and has a third via hole corresponding to the assistant electrode layer and a fourth via hole corresponding to the pixel electrode provided thereon, the gate top being electrically connected to the assistant electrode layer through the third via hole, and the source electrode being electrically connected to the pixel electrode through the fourth via hole.

12. The array substrate according to claim 8, further comprising a data line, the drain electrode being shaped in a circle, the gate bottom being shaped in a ring with an opening, and the drain electrode being electrically connected to the data line via a connecting structure passing through the opening of the gate bottom.

13. The array substrate according to claim 12, wherein the source electrode is shaped in a ring with an opening, the gate top is shaped in a ring, the second gate electrode is shaped in a circle, and the second gate electrode is electrically connected to the gate top via a connecting structure passing through the opening of the source electrode.

14. A display device, comprising an array substrate, wherein the array substrate comprises a thin film transistor, wherein the thin film transistor comprises an active layer, a source electrode, a drain electrode, and a first gate electrode, the first gate electrode being shaped in a ring, wherein the active layer includes a first portion, a second portion and a third portion connected between the first portion and the second portion, the first portion and the second portion are disposed horizontally, and connected to the source electrode and the drain electrode, respectively, the third portion is disposed obliquely and has a channel provided thereon, and at least one part of the channel is located on an inner side of the first gate electrode; and an assistant electrode layer, a gate bottom, a gate top and the assistant electrode layer in the thin film transistor being disposed in layers sequentially, and the assistant electrode layer being electrically connected to the gate top, a projection of the assistant electrode layer on the plane where the drain electrode lies and the drain electrode having an overlapping region, and a projection of the third portion on the plane where the drain electrode lies being situated within the overlapping region;

wherein the display device is an organic light-emitting diode display device, and the assistant electrode layer is an anode layer.

\* \* \* \* \*